(12) United States Patent
Lee et al.

(10) Patent No.: US 10,643,987 B2
(45) Date of Patent: May 5, 2020

(54) SEMICONDUCTOR STRUCTURES

(71) Applicant: Vanguard International Semiconductor Corporation, Hsinchu (TW)

(72) Inventors: Jian-Hsing Lee, Puzih (TW); Shao-Chang Huang, Hsinchu (TW); Chih-Hsuan Lin, Hsinchu (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 16/017,633

(22) Filed: Jun. 25, 2018

(65) Prior Publication Data

US 2019/0393208 A1 Dec. 26, 2019

(51) Int. Cl.
| | |
|---|---|
| H01L 27/092 | (2006.01) |
| H01L 27/02 | (2006.01) |
| H01L 27/07 | (2006.01) |
| H01L 29/872 | (2006.01) |
| H01L 29/74 | (2006.01) |
| H01L 29/06 | (2006.01) |
| H01L 27/06 | (2006.01) |

(52) U.S. Cl.
CPC ........ *H01L 27/0248* (2013.01); *H01L 27/067* (2013.01); *H01L 27/0727* (2013.01); *H01L 29/0649* (2013.01); *H01L 29/7412* (2013.01); *H01L 29/872* (2013.01)

(58) Field of Classification Search
None
See application file for complete search history.

(56) References Cited

U.S. PATENT DOCUMENTS

| | | | |
|---|---|---|---|
| 2003/0127694 A1* | 7/2003 | Morton | H01L 27/092 257/371 |
| 2004/0027745 A1* | 2/2004 | Kunz | H01L 27/0266 361/56 |
| 2007/0170469 A1 | 7/2007 | Wu et al. | |
| 2010/0032755 A1* | 2/2010 | Benaissa | H01L 21/82381 257/337 |
| 2015/0137255 A1* | 5/2015 | Wen | H01L 27/092 257/369 |

FOREIGN PATENT DOCUMENTS

| | | |
|---|---|---|
| CN | 2775842 Y | 4/2006 |
| CN | 1913148 A | 2/2007 |
| TW | 200727444 A | 7/2007 |

* cited by examiner

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A semiconductor structure is provided. The semiconductor structure includes a substrate, a metal layer, a gate, a drain, a source and a first doping region. The substrate has a first doping type. The metal layer is adjacent to the surface of the substrate. The gate is formed on the substrate. The drain is formed in the substrate and located at one side of the gate. The drain is adjacent to the metal layer. The source is formed in the substrate and located at another side of the gate. The first doping region is formed in the substrate and surrounds the metal layer and the drain. The first doping region has a second doping type. The second doping type is different from the first doping type.

32 Claims, 6 Drawing Sheets

SEMICONDUCTOR STRUCTURES

TECHNICAL FIELD

The technical field relates to a semiconductor structure that can effectively improve electrostatic discharge protection.

BACKGROUND

Electrostatic discharge (ESD) is the main cause of failure and damage of most electronic components. It is difficult to avoid electrostatic discharge. For example, electronic components can easily accumulate electrostatic charges during operation, especially high-voltage components that are not easily turned on. As a result, electronic components may easily be damaged by electrostatic discharge, such as when an electrostatic discharge current causes transistor components to be destroyed. Therefore, in general, an integrated circuit must be further combined with an appropriate design for electrostatic discharge protection to avoid the threat and damage to the integrated circuit caused by electrostatic discharge.

Therefore, development of a semiconductor structure that can effectively improve electrostatic discharge protection is desirable.

SUMMARY

In accordance with one embodiment of the invention, a semiconductor structure is provided. The semiconductor structure comprises a substrate, a metal layer, a gate, a drain, a source and a first doping region. The substrate has a first doping type. The metal layer is adjacent to the surface of the substrate. The gate is formed on the substrate. The drain is formed in the substrate and located at one side of the gate. The drain is adjacent to the metal layer. The source is formed in the substrate and located at another side of the gate. The first doping region is formed in the substrate and surrounds the metal layer and the drain. The first doping region has a second doping type. The second doping type is different from the first doping type.

In accordance with some embodiments, the metal layer adjacent to the surface of the substrate comprises metal silicide.

In accordance with some embodiments, the source and the drain have an n-doping type. The first doping type of the substrate is a p-doping type. The second doping type of the first doping region is an n-doping type.

In accordance with some embodiments, the source and the drain have a p-doping type. The first doping type of the substrate is an n-doping type. The second doping type of the first doping region is a p-doping type.

In accordance with some embodiments, the semiconductor structure further comprises an isolation structure formed within the first doping region and located at one side of the drain.

In accordance with some embodiments, the first doping region has a doping concentration which is the same as that of the drain.

In accordance with some embodiments, the first doping region has a doping concentration which is different from that of the drain.

In accordance with one embodiment of the invention, a semiconductor structure is provided. The semiconductor structure comprises a substrate, a metal layer, a first doping region, a second doping region and a third doping region. The substrate has a first doping type. The metal layer is adjacent to the surface of the substrate. The first doping region is formed in the substrate and adjacent to the metal layer. The second doping region is formed in the substrate which is opposite to the first doping region. The third doping region is formed in the substrate and surrounds the metal layer and the first doping region. The third doping region has a second doping type. The second doping type is different from the first doping type.

In accordance with some embodiments, the first doping region and the second doping region have an n-doping type. The first doping type of the substrate is a p-doping type. The second doping type of the third doping region is an n-doping type.

In accordance with some embodiments, the first doping region and the second doping region have a p-doping type. The first doping type of the substrate is an n-doping type. The second doping type of the third doping region is a p-doping type.

In accordance with some embodiments, the semiconductor structure further comprises an isolation structure formed within the third doping region and located at one side of the first doping region.

In accordance with some embodiments, the third doping region has a doping concentration which is the same as that of the first doping region.

In accordance with some embodiments, the third doping region has a doping concentration which is different from that of the first doping region.

In accordance with some embodiments, the first doping region has a p-doping type. The second doping region has an n-doping type. The first doping type of the substrate is a p-doping type. The second doping type of the third doping region is an n-doping type.

In accordance with some embodiments, the first doping region has an n-doping type. The second doping region has a p-doping type. The first doping type of the substrate is an n-doping type. The second doping type of the third doping region is a p-doping type.

The present invention provides an integrated semiconductor structure combining a Schottky diode with a high-voltage MOS transistor (NMOS or PMOS) to dissipate electrostatic discharge (ESD) current generated during operation of the device by the high-current characteristics of the Schottky diode. Also, in the semiconductor structure, the Schottky diode is surrounded by a doping region with a low doping concentration and a large doping range to reduce the possibility of the leakage of the Schottky diode. The integrated semiconductor structure not only maintains the driving capability of the high-voltage MOS transistor and effectively dissipates the electrostatic discharge current but also avoids the leakage of the Schottky diode due to the structural and functional mutual benefits between the Schottky diode and the MOS transistor in the semiconductor structure. In addition, the present invention also provides an application mode which combines a Schottky diode with an NPN-type or PNP-type bipolar junction transistor (BJT) and another application mode which combines a Schottky diode with a silicon controlled rectifier (SCR).

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
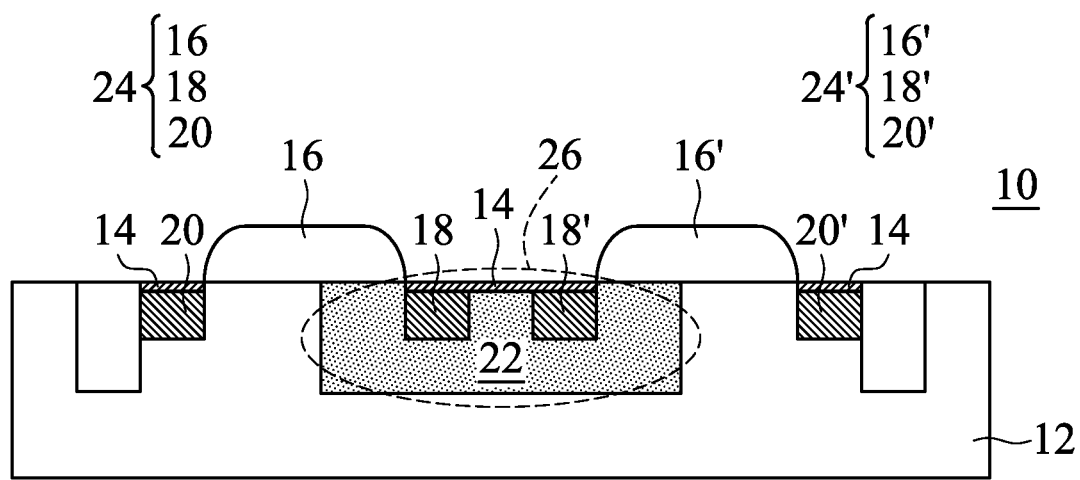
FIG. 1 is a cross-sectional view of a semiconductor structure in accordance with one embodiment of the invention.

Referring to FIG. 1, in accordance with one embodiment of the invention, a semiconductor structure 10 is provided. FIG. 1 is a cross-sectional view of the semiconductor structure 10.

As shown in FIG. 1, in this embodiment, the semiconductor structure 10 comprises a substrate 12, a metal layer 14, a first gate 16, a first drain 18, a first source 20, a second gate 16', a second drain 18', a second source 20' and a first doping region 22. The substrate 12 has a p-doping type. The metal layer 14 is adjacent to the surface of the substrate 12. The first gate 16 and the second gate 16' are formed on the substrate 12. The first drain 18 and the second drain 18' are formed in the substrate 12 and respectively located at one side of the first gate 16 and the second gate 16'. The first drain 18 and the second drain 18' are adjacent to the metal layer 14. The first source 20 and the second source 20' are formed in the substrate 12 and respectively located at another side of the first gate 16 and the second gate 16'. The first source 20 and the second source 20' are adjacent to the metal layer 14. The first drain 18, the second drain 18', the first source 20 and the second source 20' have an n-doping type. The first doping region 22 is formed in the substrate 12 and surrounds the metal layer 14, the first drain 18 and the second drain 18'. The first doping region 22 has an n-doping type.

In accordance with some embodiments, the substrate 12 may comprise silicon or another suitable substrate material.

In accordance with some embodiments, the metal layer 14 may comprise metal silicide.

In accordance with some embodiments, the metal layer 14 is located on the top of the first drain 18, the second drain 18', the first source 20 and the second source 20'. That is, the first drain 18, the second drain 18', the first source 20 and the second source 20' are connected with an external circuit (not shown) by the metal layer 14.

In accordance with some embodiments, the doping concentration of the first doping region 22 is the same as the doping concentration of the first drain 18 and the second drain 18'.

In accordance with some embodiments, the doping concentration of the first doping region 22 is different from the doping concentration of the first drain 18 and the second drain 18'. For example, the doping concentration of the first doping region 22 is lower than the doping concentration of the first drain 18 and the second drain 18'.

In this embodiment, the first gate 16, the n-doped first drain 18 and the n-doped first source 20 constitute a first n-type MOS FET 24. The second gate 16', the n-doped second drain 18' and the n-doped second source 20' constitute a second n-type MOS FET 24'. The metal layer 14 and the n-doped first doping region 22 constitute a Schottky diode 26. Therefore, the semiconductor structure 10 comprises both NMOS FETs (24 and 24') and the Schottky diode 26.

Figure 2:
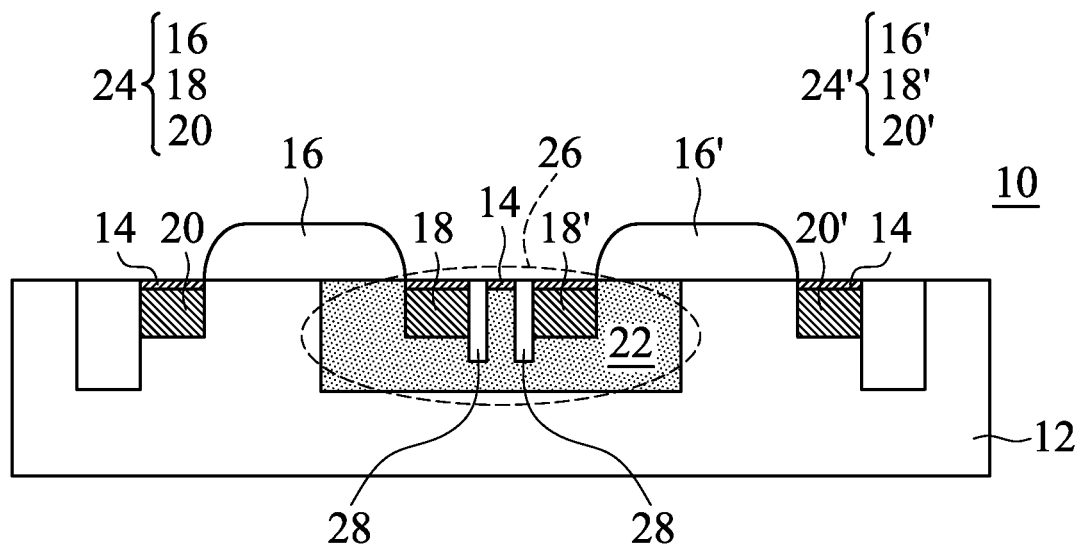
FIG. 2 is a cross-sectional view of a semiconductor structure in accordance with one embodiment of the invention.

Referring to FIG. 2, in accordance with one embodiment of the invention, a semiconductor structure 10 is provided. FIG. 2 is a cross-sectional view of the semiconductor structure 10.

As shown in FIG. 2, in this embodiment, the semiconductor structure 10 comprises a substrate 12, a metal layer 14, a first gate 16, a first drain 18, a first source 20, a second gate 16', a second drain 18', a second source 20', a first doping region 22 and an isolation structure 28. The substrate 12 has a p-doping type. The metal layer 14 is adjacent to the surface of the substrate 12. The first gate 16 and the second gate 16' are formed on the substrate 12. The first drain 18 and the second drain 18' are formed in the substrate 12 and respectively located at one side of the first gate 16 and the second gate 16'. The first drain 18 and the second drain 18' are adjacent to the metal layer 14. The first source 20 and the second source 20' are formed in the substrate 12 and respectively located at another side of the first gate 16 and the second gate 16'. The first source 20 and the second source 20' are adjacent to the metal layer 14. The first drain 18, the second drain 18', the first source 20 and the second source 20' have an n-doping type. The first doping region 22 is formed in the substrate 12 and surrounds the metal layer 14, the first drain 18 and the second drain 18'. The first doping region 22 has an n-doping type. The isolation structure 28 is formed within the first doping region 22 and located at one side of the first drain 18 and the second drain 18'.

In accordance with some embodiments, the substrate 12 may comprise silicon or another suitable substrate material.

In accordance with some embodiments, the metal layer 14 may comprise metal silicide.

In accordance with some embodiments, the metal layer 14 is located on the top of the first drain 18, the second drain 18', the first source 20 and the second source 20'. That is, the first drain 18, the second drain 18', the first source 20 and the second source 20' are connected with an external circuit (not shown) by the metal layer 14.

In accordance with some embodiments, the doping concentration of the first doping region 22 is the same as the doping concentration of the first drain 18 and the second drain 18'.

In accordance with some embodiments, the doping concentration of the first doping region 22 is different from the doping concentration of the first drain 18 and the second drain 18'. For example, the doping concentration of the first doping region 22 is lower than the doping concentration of the first drain 18 and the second drain 18'.

In accordance with some embodiments, the isolation structure 28 may comprise any suitable insulating material.

In accordance with some embodiments, the isolation structure 28 extends downward beyond the first drain 18 and the second drain 18'.

In this embodiment, the first gate 16, the n-doped first drain 18 and the n-doped first source 20 constitute a first n-type MOS FET 24. The second gate 16', the n-doped second drain 18' and the n-doped second source 20' constitute a second n-type MOS FET 24'. The metal layer 14 and the n-doped first doping region 22 constitute a Schottky diode 26. Therefore, the semiconductor structure 10 comprises both NMOS FETs (24 and 24') and the Schottky diode 26.

Figure 3:
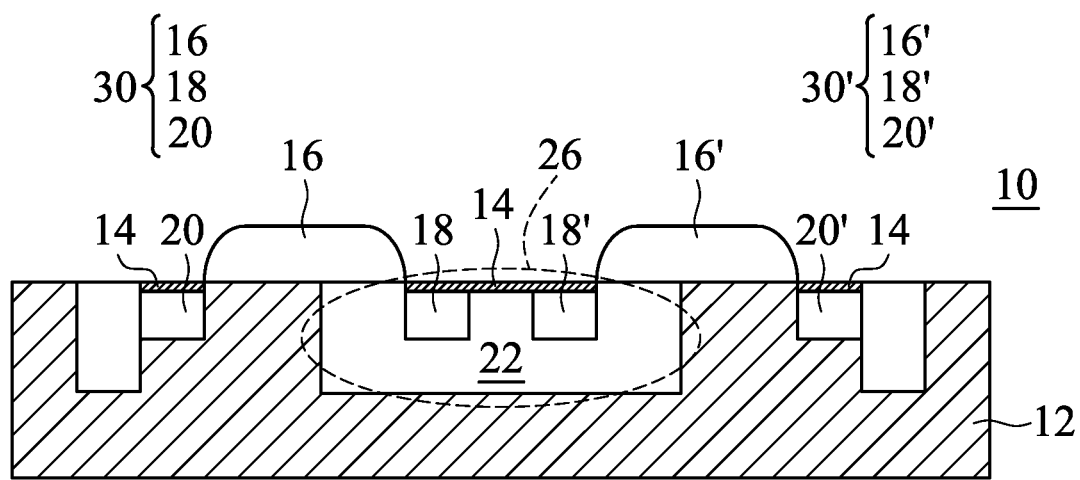
FIG. 3 is a cross-sectional view of a semiconductor structure in accordance with one embodiment of the invention.

Referring to FIG. 3, in accordance with one embodiment of the invention, a semiconductor structure 10 is provided. FIG. 3 is a cross-sectional view of the semiconductor structure 10.

As shown in FIG. 3, in this embodiment, the semiconductor structure 10 comprises a substrate 12, a metal layer 14, a first gate 16, a first drain 18, a first source 20, a second gate 16', a second drain 18', a second source 20' and a first doping region 22. The substrate 12 has an n-doping type. The metal layer 14 is adjacent to the surface of the substrate 12. The first gate 16 and the second gate 16' are formed on the substrate 12. The first drain 18 and the second drain 18' are formed in the substrate 12 and respectively located at one side of the first gate 16 and the second gate 16'. The first drain 18 and the second drain 18' are adjacent to the metal layer 14. The first source 20 and the second source 20' are formed in the substrate 12 and respectively located at another side of the first gate 16 and the second gate 16'. The first source 20 and the second source 20' are adjacent to the metal layer 14. The first drain 18, the second drain 18', the first source 20 and the second source 20' have a p-doping type. The first doping region 22 is formed in the substrate 12 and surrounds the metal layer 14, the first drain 18 and the second drain 18'. The first doping region 22 has a p-doping type.

In accordance with some embodiments, the substrate 12 may comprise silicon or another suitable substrate material.

In accordance with some embodiments, the metal layer 14 may comprise metal silicide.

In accordance with some embodiments, the metal layer 14 is located on the top of the first drain 18, the second drain 18', the first source 20 and the second source 20'. That is, the first drain 18, the second drain 18', the first source 20 and the second source 20' are connected with an external circuit (not shown) by the metal layer 14.

In accordance with some embodiments, the doping concentration of the first doping region 22 is the same as the doping concentration of the first drain 18 and the second drain 18'.

In accordance with some embodiments, the doping concentration of the first doping region 22 is different from the doping concentration of the first drain 18 and the second drain 18'. For example, the doping concentration of the first doping region 22 is lower than the doping concentration of the first drain 18 and the second drain 18'.

In this embodiment, the first gate 16, the p-doped first drain 18 and the p-doped first source 20 constitute a first p-type MOS FET 30. The second gate 16', the p-doped second drain 18' and the p-doped second source 20' constitute a second p-type MOS FET 30'. The metal layer 14 and the p-doped first doping region 22 constitute a Schottky diode 26. Therefore, the semiconductor structure 10 comprises both PMOS FETs (30 and 30') and the Schottky diode 26.

Figure 4:
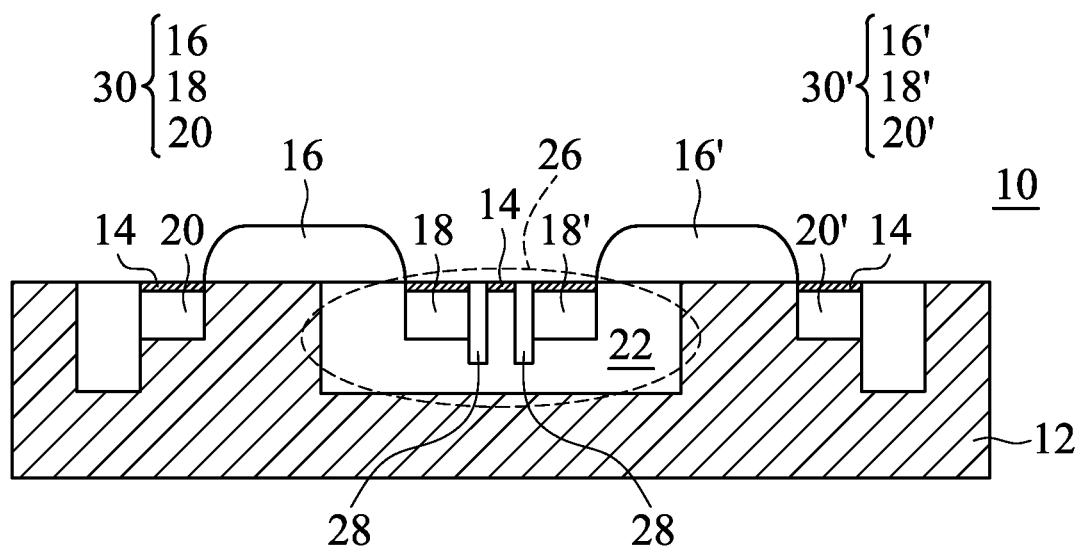
FIG. 4 is a cross-sectional view of a semiconductor structure in accordance with one embodiment of the invention.

Referring to FIG. 4, in accordance with one embodiment of the invention, a semiconductor structure 10 is provided. FIG. 4 is a cross-sectional view of the semiconductor structure 10.

As shown in FIG. 4, in this embodiment, the semiconductor structure 10 comprises a substrate 12, a metal layer 14, a first gate 16, a first drain 18, a first source 20, a second gate 16', a second drain 18', a second source 20', a first doping region 22 and an isolation structure 28. The substrate 12 has an n-doping type. The metal layer 14 is adjacent to the surface of the substrate 12. The first gate 16 and the second gate 16' are formed on the substrate 12. The first drain 18 and the second drain 18' are formed in the substrate 12 and respectively located at one side of the first gate 16 and the second gate 16'. The first drain 18 and the second drain 18' are adjacent to the metal layer 14. The first source 20 and the second source 20' are formed in the substrate 12 and respectively located at another side of the first gate 16 and the second gate 16'. The first source 20 and the second source 20' are adjacent to the metal layer 14. The first drain 18, the second drain 18', the first source 20 and the second source 20' have a p-doping type. The first doping region 22 is formed in the substrate 12 and surrounds the metal layer 14, the first drain 18 and the second drain 18'. The first doping region 22 has a p-doping type. The isolation structure 28 is formed within the first doping region 22 and located at one side of the first drain 18 and the second drain 18'.

In accordance with some embodiments, the substrate 12 may comprise silicon or another suitable substrate material.

In accordance with some embodiments, the metal layer 14 may comprise metal silicide.

In accordance with some embodiments, the metal layer 14 is located on the top of the first drain 18, the second drain 18', the first source 20 and the second source 20'. That is, the first drain 18, the second drain 18', the first source 20 and the second source 20' are connected with an external circuit (not shown) by the metal layer 14.

In accordance with some embodiments, the doping concentration of the first doping region 22 is the same as the doping concentration of the first drain 18 and the second drain 18'.

In accordance with some embodiments, the doping concentration of the first doping region 22 is different from the doping concentration of the first drain 18 and the second drain 18'. For example, the doping concentration of the first doping region 22 is lower than the doping concentration of the first drain 18 and the second drain 18'.

In accordance with some embodiments, the isolation structure 28 may comprise any suitable insulating material.

In accordance with some embodiments, the isolation structure 28 extends downward beyond the first drain 18 and the second drain 18'.

In this embodiment, the first gate 16, the p-doped first drain 18 and the p-doped first source 20 constitute a first p-type MOS FET 30. The second gate 16', the p-doped second drain 18' and the p-doped second source 20' constitute a second p-type MOS FET 30'. The metal layer 14 and the p-doped first doping region 22 constitute a Schottky diode 26. Therefore, the semiconductor structure 10 comprises both PMOS FETs (30 and 30') and the Schottky diode 26.

Figure 5:
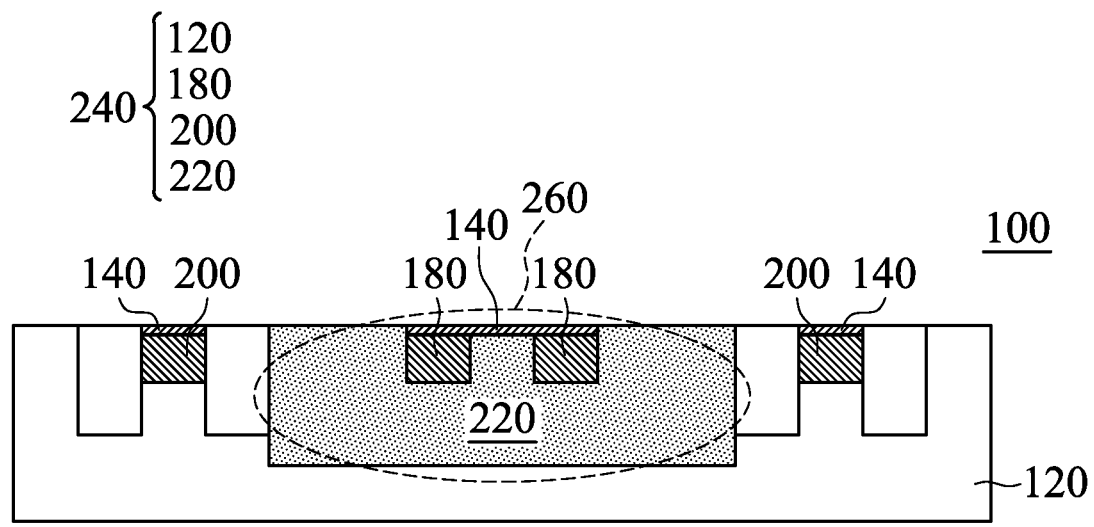
FIG. 5 is a cross-sectional view of a semiconductor structure in accordance with one embodiment of the invention.

Referring to FIG. 5, in accordance with one embodiment of the invention, a semiconductor structure 100 is provided. FIG. 5 is a cross-sectional view of the semiconductor structure 100.

As shown in FIG. 5, in this embodiment, the semiconductor structure 100 comprises a substrate 120, a metal layer 140, a plurality of first doping regions 180, a plurality of second doping regions 200 and a third doping region 220. The substrate 120 has a p-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 and the second doping regions 200 have an n-doping type. The third doping region 220 is formed in the substrate 120 and surrounds the metal layer 140 and the first doping regions 180. The third doping region 220 has an n-doping type.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In this embodiment, the n-doped first doping region 180, the n-doped third doping region 220, the p-doped substrate 120 and the n-doped second doping region 200 constitute a NPN-type bipolar junction transistor (BJT) 240. The metal layer 140 and the n-doped third doping region 220 constitute a Schottky diode 260. Therefore, the semiconductor structure 100 comprises both the NPN-type BJT 240 and the Schottky diode 260.

Figure 6:
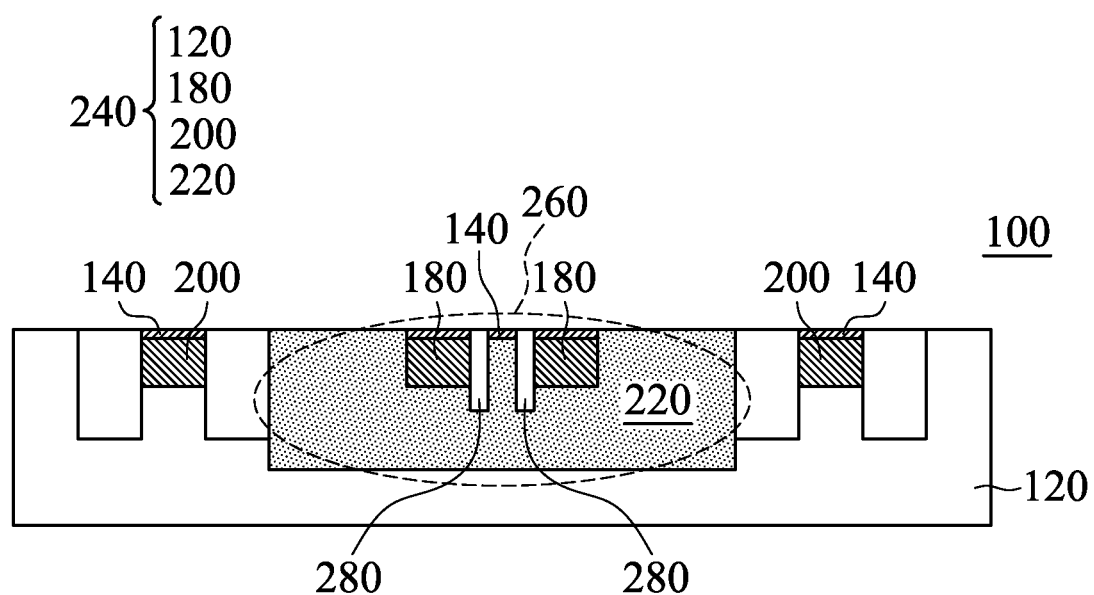
FIG. 6 is a cross-sectional view of a semiconductor structure in accordance with one embodiment of the invention.

Referring to FIG. 6, in accordance with one embodiment of the invention, a semiconductor structure 100 is provided. FIG. 6 is a cross-sectional view of the semiconductor structure 100.

As shown in FIG. 6, in this embodiment, the semiconductor structure 100 comprises a substrate 120, a metal layer 140, a plurality of first doping regions 180, a plurality of second doping regions 200, a third doping region 220 and an isolation structure 280. The substrate 120 has a p-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 and the second doping regions 200 have an n-doping type. The third doping region 220 is formed in the substrate 120 and surrounds the metal layer 140 and the first doping regions 180. The third doping region 220 has an n-doping type. In addition, the isolation structure 280 is formed within the third doping region 220 and located at one side of the first doping regions 180.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In accordance with some embodiments, the isolation structure 280 may comprise any suitable insulating material.

In accordance with some embodiments, the isolation structure 280 extends downward beyond the first doping regions 180.

In this embodiment, the n-doped first doping region 180, the n-doped third doping region 220, the p-doped substrate 120 and the n-doped second doping region 200 constitute a NPN-type bipolar junction transistor (BJT) 240. The metal layer 140 and the n-doped third doping region 220 constitute a Schottky diode 260. Therefore, the semiconductor structure 100 comprises both the NPN-type BJT 240 and the Schottky diode 260.

Figure 7:
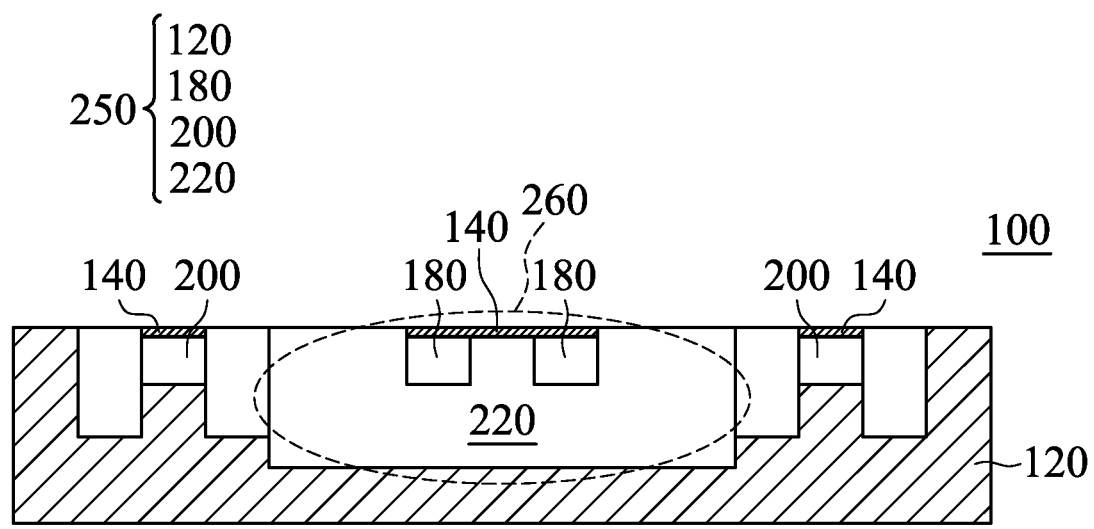
FIG. 7 is a cross-sectional view of a semiconductor structure in accordance with one embodiment of the invention.

Referring to FIG. 7, in accordance with one embodiment of the invention, a semiconductor structure 100 is provided. FIG. 7 is a cross-sectional view of the semiconductor structure 100.

As shown in FIG. 7, in this embodiment, the semiconductor structure 100 comprises a substrate 120, a metal layer 140, a plurality of first doping regions 180, a plurality of second doping regions 200 and a third doping region 220. The substrate 120 has an n-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 and the second doping regions 200 have a p-doping type. The third doping region 220 is formed in the substrate 120 and surrounds the metal layer 140 and the first doping regions 180. The third doping region 220 has a p-doping type.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In this embodiment, the p-doped first doping region 180, the p-doped third doping region 220, the n-doped substrate 120 and the p-doped second doping region 200 constitute a PNP-type bipolar junction transistor (BJT) 250. The metal layer 140 and the p-doped third doping region 220 constitute a Schottky diode 260. Therefore, the semiconductor structure 100 comprises both the PNP-type BJT 250 and the Schottky diode 260.

Figure 8:
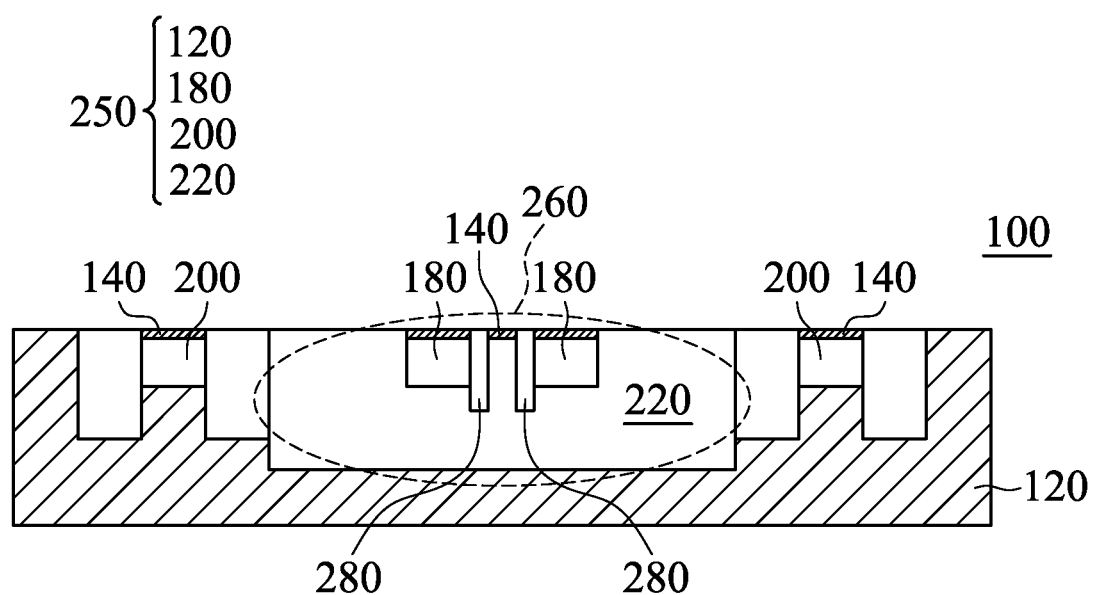
FIG. 8 is a cross-sectional view of a semiconductor structure in accordance with one embodiment of the invention.

Referring to FIG. 8, in accordance with one embodiment of the invention, a semiconductor structure 100 is provided. FIG. 8 is a cross-sectional view of the semiconductor structure 100.

As shown in FIG. 8, in this embodiment, the semiconductor structure 100 comprises a substrate 120, a metal layer 140, a plurality of first doping regions 180, a plurality of second doping regions 200, a third doping region 220 and an isolation structure 280. The substrate 120 has an n-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 and the second doping regions 200 have a p-doping type. The third doping region 220 is formed in the substrate 120 and surrounds the metal layer 140 and the first doping regions 180. The third doping region 220 has a p-doping type. In addition, the isolation structure 280 is formed within the third doping region 220 and located at one side of the first doping regions 180.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In accordance with some embodiments, the isolation structure 280 may comprise any suitable insulating material.

In accordance with some embodiments, the isolation structure 280 extends downward beyond the first doping regions 180.

In this embodiment, the p-doped first doping region 180, the p-doped third doping region 220, the n-doped substrate 120 and the p-doped second doping region 200 constitute a PNP-type bipolar junction transistor (BJT) 250. The metal layer 140 and the p-doped third doping region 220 constitute a Schottky diode 260. Therefore, the semiconductor structure 100 comprises both the PNP-type BJT 250 and the Schottky diode 260.

Figure 9:
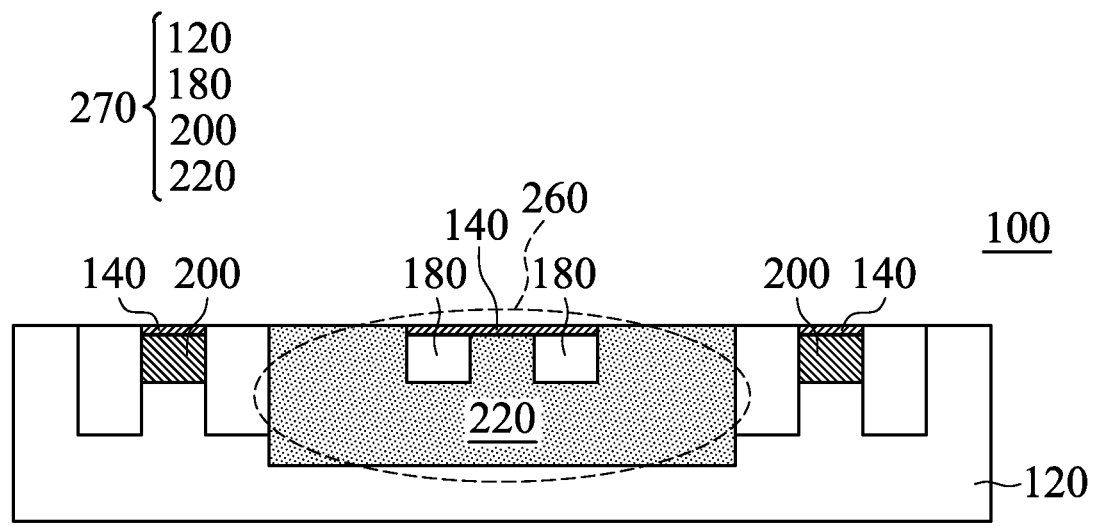
FIG. 9 is a cross-sectional view of a semiconductor structure in accordance with one embodiment of the invention.

Referring to FIG. 9, in accordance with one embodiment of the invention, a semiconductor structure 100 is provided. FIG. 9 is a cross-sectional view of the semiconductor structure 100.

As shown in FIG. 9, in this embodiment, the semiconductor structure 100 comprises a substrate 120, a metal layer 140, a plurality of first doping regions 180, a plurality of second doping regions 200 and a third doping region 220. The substrate 120 has a p-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 have a p-doping type. The second doping regions 200 have an n-doping type. The third doping region 220 is formed in the substrate 120 and surrounds the metal layer 140 and the first doping regions 180. The third doping region 220 has an n-doping type.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In this embodiment, the p-doped first doping region 180, the n-doped third doping region 220, the p-doped substrate 120 and the n-doped second doping region 200 constitute a silicon controlled rectifier (SCR) 270. The metal layer 140 and the n-doped third doping region 220 constitute a Schottky diode 260. Therefore, the semiconductor structure 100 comprises both the silicon controlled rectifier (SCR) 270 and the Schottky diode 260.

Figure 10:
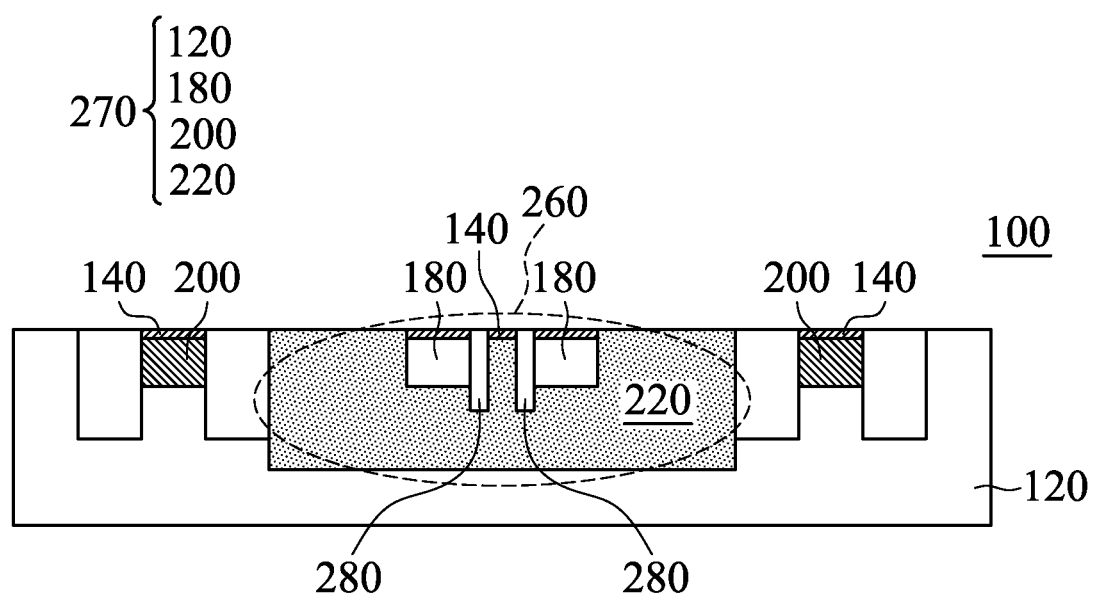
FIG. 10 is a cross-sectional view of a semiconductor structure in accordance with one embodiment of the invention.

Referring to FIG. 10, in accordance with one embodiment of the invention, a semiconductor structure 100 is provided. FIG. 10 is a cross-sectional view of the semiconductor structure 100.

As shown in FIG. 10, in this embodiment, the semiconductor structure 100 comprises a substrate 120, a metal layer 140, a plurality of first doping regions 180, a plurality of second doping regions 200, a third doping region 220 and an isolation structure 280. The substrate 120 has a p-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 have a p-doping type. The second doping regions 200 have an n-doping type. The third doping region 220 is formed in the substrate 120 and surrounds the metal layer 140 and the first doping regions 180. The third doping region 220 has an n-doping type. In addition, the isolation structure 280 is formed within the third doping region 220 and located at one side of the first doping regions 180.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In accordance with some embodiments, the isolation structure 280 may comprise any suitable insulating material.

In accordance with some embodiments, the isolation structure 280 extends downward beyond the first doping regions 180.

In this embodiment, the p-doped first doping region 180, the n-doped third doping region 220, the p-doped substrate 120 and the n-doped second doping region 200 constitute a silicon controlled rectifier (SCR) 270. The metal layer 140 and the n-doped third doping region 220 constitute a Schottky diode 260. Therefore, the semiconductor structure 100 comprises both the silicon controlled rectifier (SCR) 270 and the Schottky diode 260.

Figure 11:
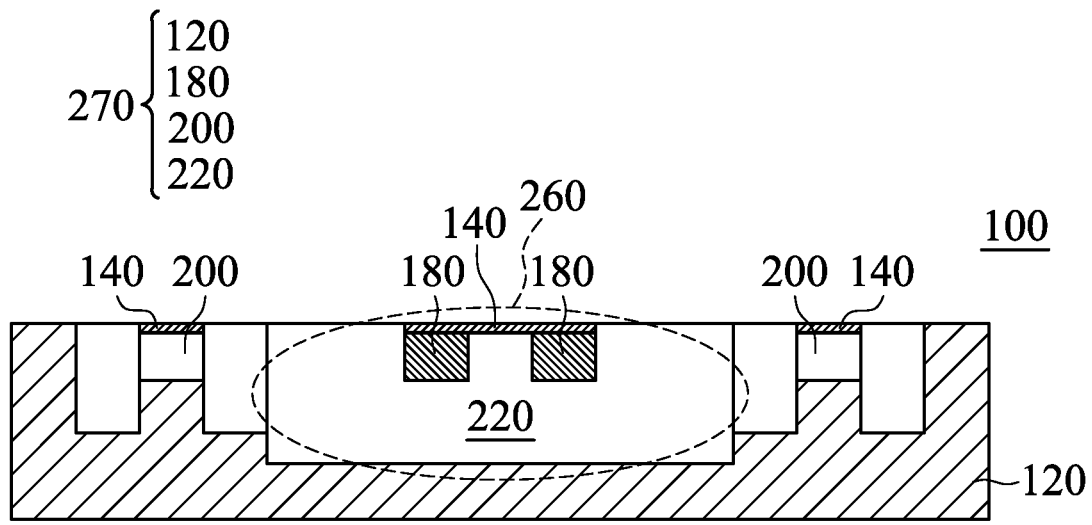
FIG. 11 is a cross-sectional view of a semiconductor structure in accordance with one embodiment of the invention.

Referring to FIG. 11, in accordance with one embodiment of the invention, a semiconductor structure 100 is provided. FIG. 11 is a cross-sectional view of the semiconductor structure 100.

As shown in FIG. 11, in this embodiment, the semiconductor structure 100 comprises a substrate 120, a metal layer 140, a plurality of first doping regions 180, a plurality of second doping regions 200 and a third doping region 220. The substrate 120 has an n-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 have an n-doping type. The second doping regions 200 have a p-doping type. The third doping region 220 is formed in the substrate 120 and surrounds the metal layer 140 and the first doping regions 180. The third doping region 220 has a p-doping type.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In this embodiment, the n-doped first doping region 180, the p-doped third doping region 220, the n-doped substrate 120 and the p-doped second doping region 200 constitute a silicon controlled rectifier (SCR) 270. The metal layer 140 and the n-doped third doping region 220 constitute a Schottky diode 260. Therefore, the semiconductor structure 100 comprises both the silicon controlled rectifier (SCR) 270 and the Schottky diode 260.

Figure 12:
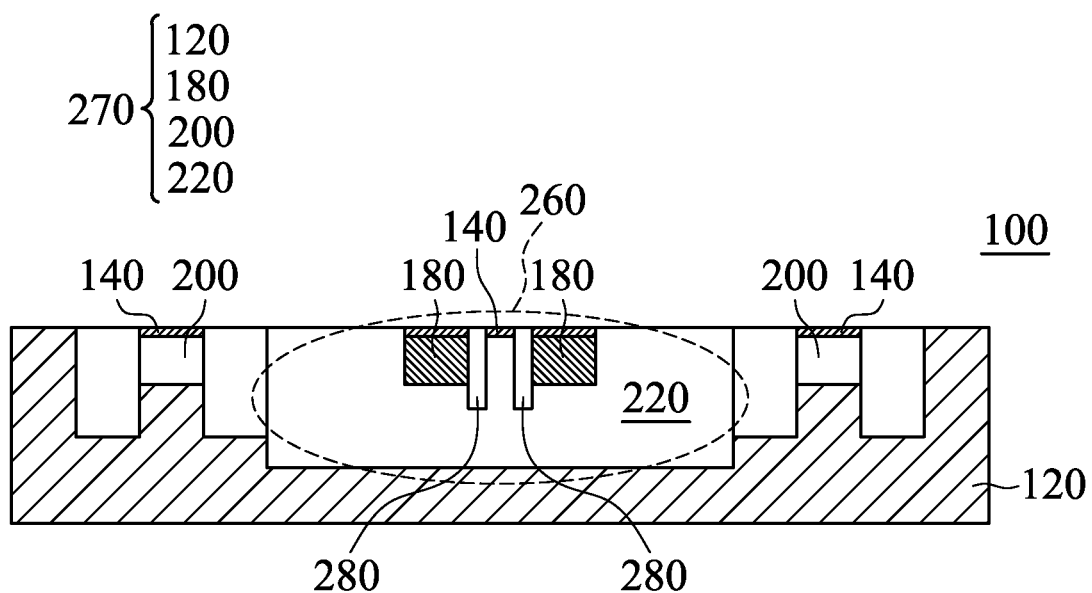
FIG. 12 is a cross-sectional view of a semiconductor structure in accordance with one embodiment of the invention.

Referring to FIG. 12, in accordance with one embodiment of the invention, a semiconductor structure 100 is provided. FIG. 12 is a cross-sectional view of the semiconductor structure 100.

As shown in FIG. 12, in this embodiment, the semiconductor structure 100 comprises a substrate 120, a metal layer 140, a plurality of first doping regions 180, a plurality of second doping regions 200, a third doping region 220 and an isolation structure 280. The substrate 120 has an n-doping type. The metal layer 140 is adjacent to the surface of the substrate 120. The plurality of first doping regions 180 are formed in the substrate 120 and adjacent to the metal layer 140. The plurality of second doping regions 200 are formed in the substrate 120 and adjacent to the metal layer 140. The second doping regions 200 are opposite to the first doping regions 180. The first doping regions 180 have an n-doping type. The second doping regions 200 have a p-doping type. The third doping region 220 is formed in the substrate 120 and surrounds the metal layer 140 and the first doping regions 180. The third doping region 220 has a p-doping type. In addition, the isolation structure 280 is formed within the third doping region 220 and located at one side of the first doping regions 180.

In accordance with some embodiments, the substrate 120 may comprise silicon or another suitable substrate material.

In accordance with some embodiments, the metal layer 140 may comprise metal silicide.

In accordance with some embodiments, the metal layer 140 is located on the top of the first doping regions 180 and the second doping regions 200. That is, the first doping regions 180 and the second doping regions 200 are connected with an external circuit (not shown) by the metal layer 140.

In accordance with some embodiments, the doping concentration of the third doping region 220 is the same as the doping concentration of the plurality of first doping regions 180.

In accordance with some embodiments, the doping concentration of the third doping region 220 is different from the doping concentration of the first doping regions 180. For example, the doping concentration of the third doping region 220 is lower than the doping concentration of the first doping regions 180.

In accordance with some embodiments, the isolation structure 280 may comprise any suitable insulating material.

In accordance with some embodiments, the isolation structure 280 extends downward beyond the first doping regions 180.

In this embodiment, the n-doped first doping region 180, the p-doped third doping region 220, the n-doped substrate 120 and the p-doped second doping region 200 constitute a silicon controlled rectifier (SCR) 270. The metal layer 140 and the n-doped third doping region 220 constitute a Schottky diode 260. Therefore, the semiconductor structure 100 comprises both the silicon controlled rectifier (SCR) 270 and the Schottky diode 260.

The present invention provides an integrated semiconductor structure combining a Schottky diode with a high-voltage MOS transistor (NMOS or PMOS) to dissipate electrostatic discharge (ESD) current generated during operation of the device by the high-current characteristics of the Schottky diode. Also, in the semiconductor structure, the Schottky diode is surrounded by a doping region with a low doping concentration and a large doping range to reduce the possibility of the leakage of the Schottky diode. The integrated semiconductor structure not only maintains the driving capability of the high-voltage MOS transistor and effectively dissipates the electrostatic discharge current but also avoids the leakage of the Schottky diode due to the structural and functional mutual benefits between the Schottky diode and the MOS transistor in the semiconductor structure. In addition, the present invention also provides an application mode which combines a Schottky diode with an NPN-type or PNP-type bipolar junction transistor (BJT) and another application mode which combines a Schottky diode with a silicon controlled rectifier (SCR).

While the invention has been described by way of example and in terms of preferred embodiment, it should be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a substrate having a surface and a first doping type;
a metal layer having a lower surface, the metal layer being formed in the substrate and coplanar with the substrate;
a first gate formed on the substrate;
a first drain formed in the substrate and located at one side of the first gate, the first drain being in contact with the metal layer;
a first source formed in the substrate and located at another side of the first gate;
a second gate formed on the substrate;
a second drain formed in the substrate and located at one side of the second gate, the second drain being adjacent to the first drain and in contact with the metal layer;
a second source formed in the substrate and located at another side of the second gate; and
a first doping region continuously formed in the substrate and surrounding the metal layer, the first drain and the second drain adjacent to the first drain, wherein the first doping region has a second doping type, and the second doping type is different from the first doping type, wherein the lower surface of the metal layer is in contact with the first drain, the second drain and the first doping region, so as to form a Schottky diode.

2. The semiconductor structure as claimed in claim 1, wherein the metal layer comprises metal silicide.

3. The semiconductor structure as claimed in claim 1, wherein the first and second sources and the first and second drains have an n-doping type.

4. The semiconductor structure as claimed in claim 3, wherein the first doping type is a p-doping type.

5. The semiconductor structure as claimed in claim 4, wherein the second doping type is an n-doping type.

6. The semiconductor structure as claimed in claim 5, further comprising an isolation structure formed within the first doping region and located at one side of the first and second drains.

7. The semiconductor structure as claimed in claim 1, wherein the first and second sources and the first and second drains have a p-doping type.

8. The semiconductor structure as claimed in claim 7, wherein the first doping type is an n-doping type.

9. The semiconductor structure as claimed in claim 8, wherein the second doping type is a p-doping type.

10. The semiconductor structure as claimed in claim 9, further comprising an isolation structure formed within the first doping region and located at one side of the first and second drains.

11. The semiconductor structure as claimed in claim 1, wherein the first doping region has a doping concentration which is the same as that of the first and second drains.

12. The semiconductor structure as claimed in claim 1, wherein the first doping region has a doping concentration which is different from that of the first and second drains.

13. A semiconductor structure, comprising:
a substrate having a surface and a first doping type;
a metal layer having a lower surface, the metal layer being formed in the substrate and coplanar with the substrate;
two first doping regions formed in the substrate and adjacent to each other, and the two first doping regions being in contact with the metal layer;
two second doping regions formed in the substrate respectively opposite to the two first doping regions; and
a third doping region continuously formed in the substrate and surrounding the metal layer and the two first doping regions adjacent to each other, wherein the third doping region has a second doping type, and the second doping type is different from the first doping type, wherein the lower surface of the metal layer is in contact with the two first doping regions and the third doping region, so as to form a Schottky diode.

14. The semiconductor structure as claimed in claim 13, wherein the metal layer comprises metal silicide.

15. The semiconductor structure as claimed in claim 13, wherein the first doping regions and the second doping regions have an n-doping type.

16. The semiconductor structure as claimed in claim 15, wherein the first doping type is a p-doping type.

17. The semiconductor structure as claimed in claim 16, wherein the second doping type is an n-doping type.

18. The semiconductor structure as claimed in claim 17, further comprising an isolation structure formed within the third doping region and located at one side of the first doping regions.

19. The semiconductor structure as claimed in claim 13, wherein the first doping regions and the second doping regions have a p-doping type.

20. The semiconductor structure as claimed in claim 19, wherein the first doping type is an n-doping type.

21. The semiconductor structure as claimed in claim 20, wherein the second doping type is a p-doping type.

22. The semiconductor structure as claimed in claim 21, further comprising an isolation structure formed within the third doping region and located at one side of the first doping regions.

23. The semiconductor structure as claimed in claim 13, wherein the third doping region has a doping concentration which is the same as that of the first doping regions.

24. The semiconductor structure as claimed in claim 13, wherein the third doping region has a doping concentration which is different from that of the first doping regions.

25. The semiconductor structure as claimed in claim 13, wherein the first doping regions have a p-doping type, and the second doping regions have an n-doping type.

26. The semiconductor structure as claimed in claim 25, wherein the first doping type is a p-doping type.

27. The semiconductor structure as claimed in claim 26, wherein the second doping type is an n-doping type.

28. The semiconductor structure as claimed in claim 27, further comprising an isolation structure formed within the third doping region and located at one side of the first doping regions.

29. The semiconductor structure as claimed in claim 13, wherein the first doping regions have an n-doping type, and the second doping regions have a p-doping type.

30. The semiconductor structure as claimed in claim 29, wherein the first doping type is an n-doping type.

31. The semiconductor structure as claimed in claim 30, wherein the second doping type is a p-doping type.

32. The semiconductor structure as claimed in claim 31, further comprising an isolation structure formed within the third doping region and located at one side of the first doping regions.

\* \* \* \* \*